US007944317B2

(12) United States Patent
Strabley et al.

(10) Patent No.: US 7,944,317 B2
(45) Date of Patent: May 17, 2011

(54) COLD ATOM MICRO PRIMARY STANDARD

(75) Inventors: Jennifer S. Strabley, Maple Grove, MN (US); Daniel W. Youngner, Maple Grove, MN (US); Lisa M. Lust, Plymouth, MN (US); Thomas Ohnstein, Roseville, MN (US); Bernard Fritz, Eagan, MN (US)

(73) Assignee: Honeywell International Inc., Morristown, NJ (US)

( * ) Notice: Subject to any disclaimer, the term of this patent is extended or adjusted under 35 U.S.C. 154(b) by 226 days.

(21) Appl. No.: 12/484,899

(22) Filed: Jun. 15, 2009

(65) Prior Publication Data

US 2010/0033256 A1 Feb. 11, 2010

Related U.S. Application Data

(60) Provisional application No. 61/087,955, filed on Aug. 11, 2008.

(51) Int. Cl.
*H03L 7/26* (2006.01)

(52) U.S. Cl. ............................ 331/94.1; 331/3; 250/251

(58) Field of Classification Search .............. 331/3, 94.1
See application file for complete search history.

(56) References Cited

U.S. PATENT DOCUMENTS

| | | | | |
|---|---|---|---|---|
| 5,528,028 | A * | 6/1996 | Chu et al. | 250/251 |
| 6,303,928 | B1 | 10/2001 | Buell et al. | |
| 6,570,459 | B1 | 5/2003 | Nathanson et al. | |
| 6,900,702 | B2 | 5/2005 | Youngner et al. | |
| 7,323,941 | B1 | 1/2008 | Happer et al. | |
| 7,379,486 | B2 | 5/2008 | Lust et al. | |
| 7,446,618 | B2 | 11/2008 | Koyama | |
| 7,468,637 | B2 | 12/2008 | Braun et al. | |
| 2006/0022761 | A1 | 2/2006 | Abeles et al. | |
| 2007/0200643 | A1 | 8/2007 | Dimarcq et al. | |
| 2008/0267232 | A1 | 10/2008 | DeNatale | |

OTHER PUBLICATIONS

Denatale et al., "Compact, Low-Power Chip-Scale Atomic Clock", "Position, Location and Navigation Symposium", May 5-8, 2008, pp. 67-70, Publisher: IEEE, Published in: Thousand Oaks, CA.

European Patent Office, "European Search Report", Jan. 28, 2011, Published in: EP.

Lutwak et al., "The Mac—A Miniature Atomic Clock", "Frequency Control Symposium and Exposition, 2005. Proceedings of the 2005 IEEE International", Aug. 29-31, 2005, Publisher: IEEE.

* cited by examiner

*Primary Examiner* — Robert Pascal
*Assistant Examiner* — James E Goodley
(74) *Attorney, Agent, or Firm* — Fogg & Powers LLC

(57) ABSTRACT

An atomic clock having a physics package that includes a vacuum chamber cavity that holds atoms of Rb-87 under high vacuum conditions, an optical bench having a single laser light source, a local oscillator, a plurality of magnetic field coils, an antenna, at least one photo-detector and integrated control electronics. The single laser light source has a fold-retro-reflected design to create three retro-reflected optical beams that cross at 90° angles relative to one another in the vacuum chamber cavity. This design allows the single laser light source to make the required six trapping beams needed to trap and cool the atoms of Rb-87. The foregoing design makes possible atomic clocks having reduced size and power consumption and capable of maintaining an ultra-high vacuum without active pumping.

20 Claims, 4 Drawing Sheets

COLD ATOM MICRO PRIMARY STANDARD

CROSS REFERENCE TO RELATED APPLICATIONS

This application is related to and claims the benefit of U.S. Provisional Application Ser. No. 61/087,955 filed Aug. 11, 2008, the disclosure of which is incorporated herein by reference in its entirety.

This application is related to U.S. patent application Ser. No. 12,484,878, filed on even date herewith, entitled "PHYSICS PACKAGE DESIGN FOR A COLD ATOM PRIMARY FREQUENCY STANDARD," which is incorporated herein by reference.

BACKGROUND OF THE INVENTION

Primary frequency standards are atomic clocks that do not need calibration and can run autonomously for long periods of time with minimal time loss. One such atomic clock utilizes an expanding cloud of laser cooled atoms of an alkali metal such as cesium. Usually these primary frequency standards are large and consume a lot of power. While some progress has been made in reducing the size and power consumption of primary frequency standards, further such reductions, while difficult to achieve, are needed for both military and civilian applications.

SUMMARY OF THE INVENTION

Embodiments of the primary frequency standard described below provide a new type of atomic clock with performance capable of serving as a primary frequency standard ("PFS"). Some of these embodiments make possible a total clock package having a volume up to approximately 5 $cm^3$ and a time loss of less than 5 ns per day.

One embodiment of the atomic clock is based on the Rubidium-87 (Rb-87) 6.8 GHz ground hyperfine state frequency splitting in an expanding cloud of cold atoms. The operating principle is designed in the spirit of the NIST-F1 fountain clock (the US primary frequency standard), but will not require the gimbal mounting previously needed to maintain the orientation of the NISF-F1 fountain clock's axis along the direction of gravity.

In alternative embodiments of the atomic clock, the major components of the atomic clock include a physics package that includes a vacuum chamber cavity that holds Rb-87 atoms under high vacuum conditions, a frequency stabilized single laser light source such as a Vertical Cavity Surface Emitting Laser ("VCSEL"), a local oscillator ("LO"), a plurality of magnetic field coils, an antenna, at least one photodetector and integrated control electronics.

In another embodiment of the atomic clock, a Magneto Optical Trap ("MOT") arrangement of laser beams is used to capture, confine, and cool about 10 million Rb-87 atoms from ambient temperature to approximately 20 μK, resulting in a reduction of 10e7x in temperature and 3000× in velocity. The atoms' internal ground state energy level spacing is probed during free-fall using time-domain Ramsey spectroscopy or Rabi spectroscopy using a microwave field tuned to the alkali ground state hyperfine energy level splitting. The clock linewidth is inversely proportional to the time between the Ramsey pulses or the length of the Rabi pulse. Using this cold, slow moving sample of atoms, the Ramsey pulses can be spaced far apart in time (approximately 10 to 15 ms) and clock linewidths are anticipated at less than 70 Hz. The microwave field is sourced by a local oscillator; the LO provides the short term stability for the clock. The LO frequency is locked to the frequency which maximizes the number of atoms in the upper hyperfine state after the second Ramsey pulse. The atoms determine the long term stability of the clock, typically measured with Allan deviation. Owing to the narrow linewidth and large number of atoms in the MOT providing ample signal to noise ratio, this clock could have an Allan deviation ($\sigma_y$) of $\sigma_y$ approximately $10\times10^{-14}$ at one hour integration time.

In other embodiments of the atomic clock, Ring Laser Gyroscope ("RLG") fabrication techniques are used to construct a physics package that is compatible with high performance and high volume manufacturing. Embodiments of the atomic clock include a single VCSEL in a fold-retro-reflected design to make the required six trapping beams required to trap and cool atoms. The physics package shape accommodates this design and auto-aligns optical beams with high quality custom dielectric mirrors frit bonded to the outside of the physics package. Integrated low-noise photodiodes readout the clock signal. This eliminates the need for gimbal mounted mirrors and other bulk optics and the need for costly manual alignments while providing a sealed chamber compatible with high vacuum performance. In one embodiment, the atomic clock is a hand-held cold atom device.

In additional embodiments of the atomic clock, only a single VCSEL is used to provide all optical beams. External cavity VCSEL technology is used to create narrower linewidths than the traditional VCSEL. VCSEL technology is advantageous because of its higher energy efficiency (greater than approximately 30%) in a small package (on the order of approximately 0.2 $cm^3$) compared with other semiconductor lasers.

In further embodiments of the atomic clock, the local oscillator has a Micro-Electromechanical System ("MEMS") resonator design which achieves sufficient resonator Q at 6.8 GHz to enable a closed-loop feedback oscillator output 3 dB linewidth of 0.1 Hz at a precision frequency of 6.834682 GHz, while also being thermally insensitive and consuming less than 10 mW of power. The quality factor (also referred to as the Q factor) of a resonator is a measure of the strength of the damping of the resonator's oscillations, or for the relative linewidth. Other LO technology could be implemented, such as a frequency tuned, low power Colpitts oscillator.

Advantages of some of the embodiments of the atomic clock include frequency stabilizing of the VCSEL laser frequency to an atomic hyperfine transition for long term, unaided operation. Using smart autonomous control loops and high precision VCSEL temperature stabilization techniques and a MEMS micro-fabricated miniature Rb-87 vapor cell, VCSEL frequency will stay locked on an atomic transition without human intervention.

Another advantage of some embodiments of the atomic clock includes greater than ten times reduction in the required optical power compared to the cold atom state-of-the art. By using a folded retro-reflected architecture, efficient use is made of the VCSEL's optical power, enabling low power operation.

In further embodiments of the atomic clock described below, an optically transparent MEMS antenna sub-assembly is used to couple the 6.8 GHz radiation into the Rb-87 atoms, which probes the energy level spacing during free-fall expansion of the atoms. This approach eliminates the need for a separate VCSEL to optically excite a Coherent Population Trapping ("CPT") resonance, eliminates time-dependent stark shifts in the clock frequency, is readily miniaturizable (compared to a microwave cavity), and can be placed close to the atoms to enable power reduction.

In other embodiments of the atomic clock, nanostructure diffractive elements (such as MEMS diffractive optics) are used in precision mounted alignment grooves to replace bulk quarter waveplate, enabling small size and eliminating manual alignments.

In yet another embodiment of the atomic clock, the atomic clock comprises: a physics package that includes a vacuum chamber cavity that holds alkali metal atoms under vacuum, an arrangement of light paths and mirrors that directs a beam of light from a single laser light source through the physics package to create three retro-reflected optical beams that cross at 90° angles relative to one another in the vacuum chamber cavity and one at least one photo-detector port; a micro-optics bench that comprises the single laser light source and a vapor cell containing an alkali metal for frequency stabilizing the light from the single laser light source to a frequency corresponding to a predetermined atomic transition of the alkali metal, and a distribution mirror for partitioning the beam of light from the single laser light source to the vapor cell and the physics package; a plurality of magnetic field coils for generating magnetic fields, specifically a gradient field for the magneto-optical trap and a homogeneous bias field for splitting the magnetic states during free-fall; a local oscillator for generating a microwave signal corresponding to the predetermined atomic transition of the alkali metal; an antenna for coupling the microwave signal to the alkali metal atoms of the physics package; at least one photo-detector for the detection of florescent light emissions of the alkali metal atoms of the physics package; and control electronics for providing power to the atomic clock, controlling the operation of the atomic clock and processing signals from the photo-detector.

In other embodiments of the primary frequency standard, a method of forming a precision frequency standard is provided. The method comprises: cooling and loading a population of alkali metal atoms contained within a passive vacuum in a magneto optical trap formed using a magnetic field and a beam of light from a single laser light source having a retro-reflected configuration that creates three retro-reflected optical beams that cross at 90° angles relative to one another; extinguishing the magnetic and optical trap and applying a small bias magnetic field to allow the alkali metal atoms to move from a higher energy state to a lower energy state; performing time-domain Ramsey spectroscopy (also referred to herein as Ramsey interrogation) or Rabi spectroscopy using microwave signals generated by a local oscillator and coupled to the alkali metal atoms by an antenna to probe the frequency splitting of the alkali metal atoms; measuring the florescent light emissions of the alkali metal atoms with a photodetector to determine the fraction of the alkali metal atoms in the higher ground state energy level; and stabilizing the frequency of the microwave signal generated by the local oscillator to the frequency that maximizes the number of alkali metal atoms in the higher energy state after the Ramsey interrogation, corresponding to an LO frequency which matches the atomic ground state resonance.

Advantages of embodiments of miniaturized atomic clock are discussed here. Unlike micro beam clocks, embodiments of the atomic clock described below are miniaturized and still have a narrow clock linewidth. Since many clock frequency-shift errors scale with the linewidth, a clock producing a large linewidth will also have proportionally larger frequency-shift errors. Also, there are no consumables, since a small sample of Rb-87 is continuously recycled yielding a long lifetime. Unlike vapor cell clocks, embodiments of the miniaturized atomic clocks do not use buffer gasses, eliminating unpredictable frequency shifts. Unlike beam clocks or vapor cell clocks which use coherent population trapping, measuring the clock frequency is immune to time-dependent stark shifts, for instance those caused by VCSEL aging, thus eliminating a time-dependent clock frequency.

BRIEF DESCRIPTION OF THE DRAWINGS

FIG. 1-1 is a chart illustrating one example of a fluorescence maximum;

Like reference numbers and designations in the various drawings indicate like elements.

DETAILED DESCRIPTION OF THE PREFERRED EMBODIMENTS

The principles underlying an embodiment of an atomic clock will now be described. In doing so, reference will be made to FIG. 1, a block diagram of one embodiment of an atomic clock 8, and FIG. 2, which is an energy level and frequency diagram for the alkali metal Rb-87.

Figure 1:
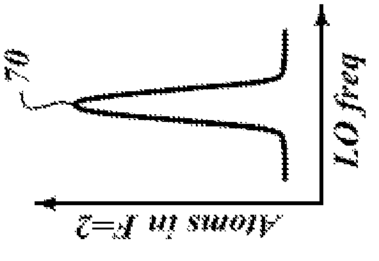
FIG. 1 is a block diagram of one embodiment of an atomic clock.
Figure 1:
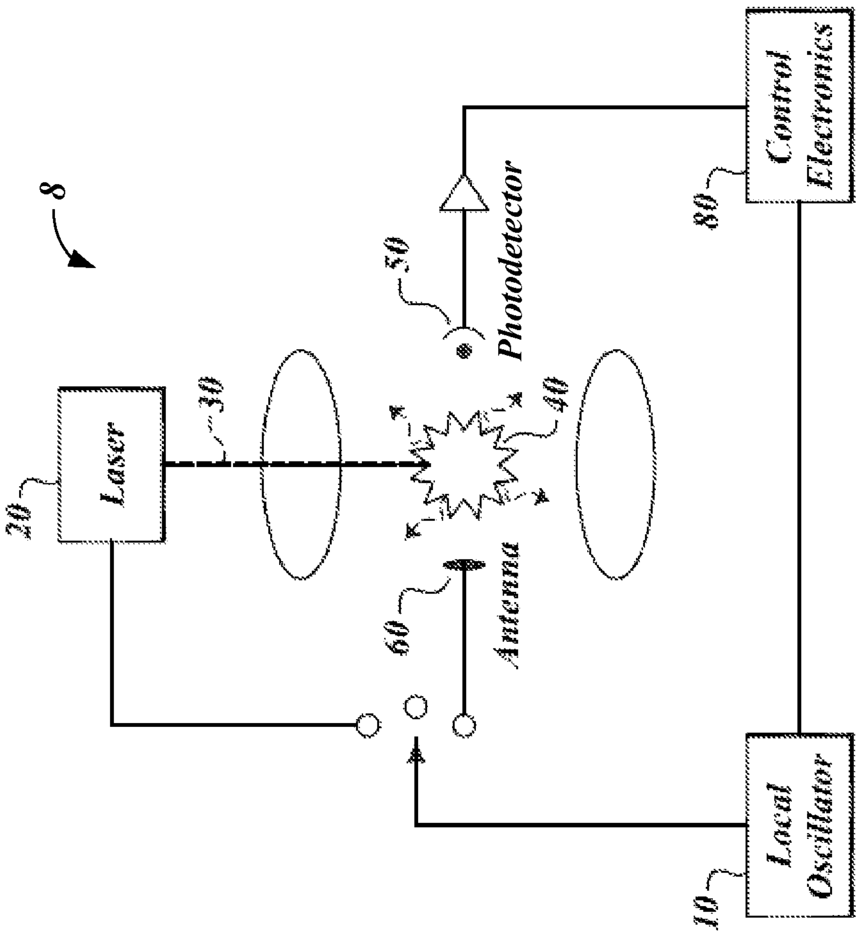
Figure 2:
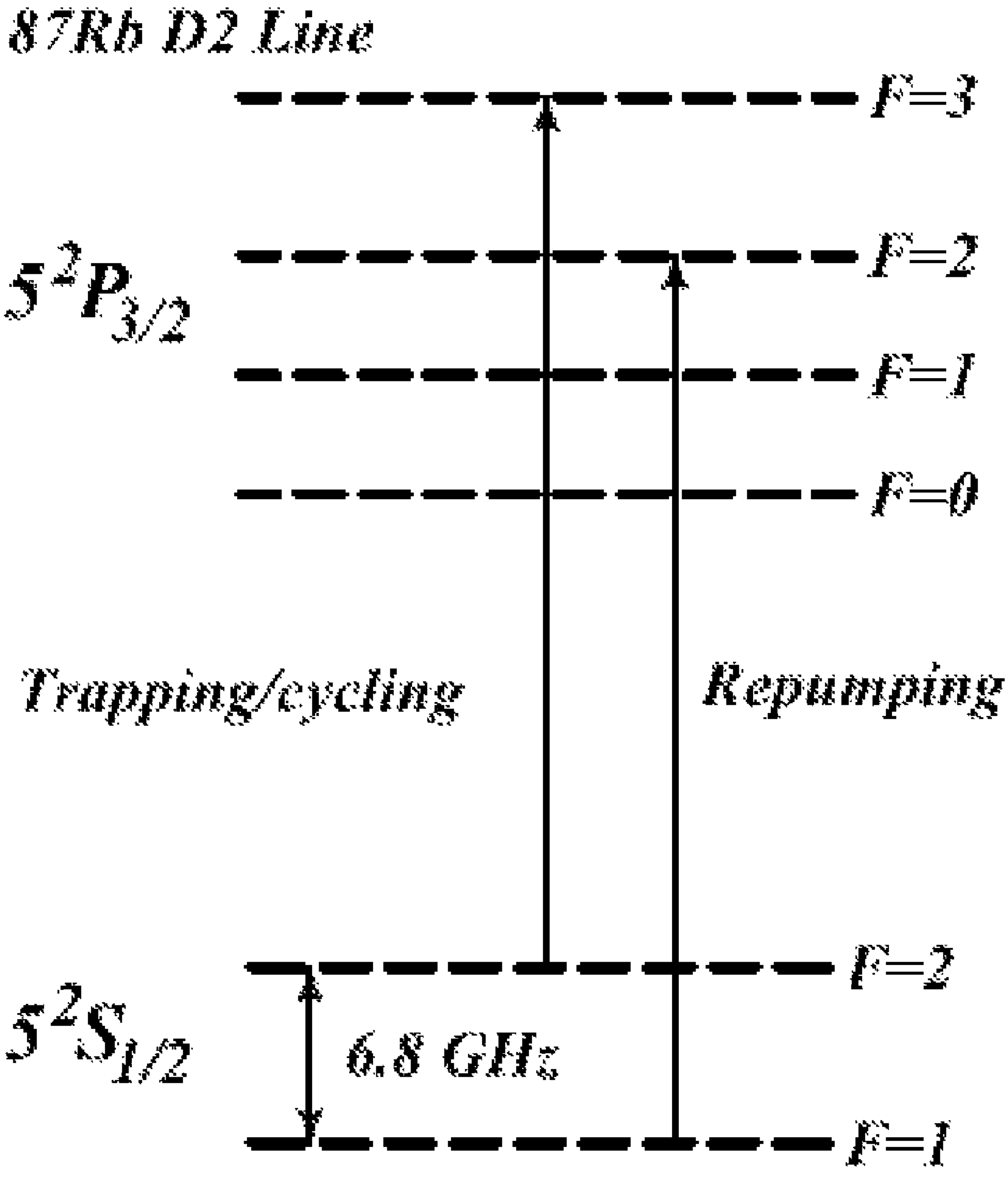
FIG. 2 is an energy level and frequency diagram for Rb-87.

The embodiment described here in connection with FIGS. 1 and 2 is based on the 6.834682 GHz frequency splitting between the F=1 and F=2 ground hyperfine states in Rb-87 (FIG. 2). A local oscillator ("LO") 10, such as a micro-electro mechanical system ("MEMS") resonator or an electronic Colpitts oscillator, is stabilized to be resonant with the 6.8 GHz atomic transition. As shown in FIG. 1, a laser 20 generates a laser beam 30 that is used to cool Rb-87 atoms 40. Because the Rb-87 atoms 40 are laser cooled (as described in more detail below), the cold atoms move slowly so that there can be long observations times yielding very narrow clock linewidths without requiring a large physics package. Near-resonant 'trapping photons' are used (FIG. 2) to laser cool a background vapor of Rb-87 atoms 40 to a temperature of ~20 μK, a reduction of 10e7x in temperature and 3000× in velocity, and then trap the atoms in a Magneto Optical Trap ("MOT").

In the MOT, the magnetic and optical fields create complicated Zeeman and Stark shifts which modify the energy level spacing between the ground hyperfine states, a non-ideal condition for probing a clock frequency. On the contrary, when the MOT fields are extinguished, the energy level shifts will disappear and the cold Rb-87 atoms 40 can then be probed in the absence of any external fields. Once extinguished the Rb-87 atoms 40 are no longer trapped and are free to expand, but expand slowly due to their low velocities.

A clock resonance is formed by sweeping the local oscillator 10 over the 6.8 GHz resonance and monitoring the fraction of atoms in F=2 (via fluorescence detection) on a photo-detector 50 such as a photodiode. Alternative embodiments of the atomic clock include more than one photo-detector 50. The microwave frequency is delivered to the atoms via an antenna 60, such as a MEMS antenna. Alternative embodiments of the atomic clock deliver microwave frequency to the atoms using coils, a microwave horn, an integrated waveguide, or the like. The fluorescence is a measure of the number of atoms in F=2 and is maximized when the LO frequency is on resonance with the 6.8 GHz hyperfine frequency. The LO 10 is locked to the fluorescence maximum 70 (FIG. 1-1). Control electronics 80 control the functioning of the clock.

Referring now to FIG. 2, a MOT requires two frequencies, the trapping frequency and the repumping frequency. The trapping transition is a cycling transition; Rb-87 atoms scatter many (such as 50,000) trapping photons before leaking into the F=1 level. The laser 20 is used to repopulate the F=2 level ("repumping") and Rb-87 atoms continue the scattering of trapping photons. An ion pump as shown in the embodiment of FIG. 1 is unnecessary in FIG. 2 due to using ultra-high vacuum ("UHV") cleaning and packaging techniques used for RLG fabrication and UV tube production.

During the Rb-87 atoms' slow expansion, the 6.8 GHz transition is probed. In traditional clocks, Ramsey spectroscopy is performed in the spatial domain when atoms travel through two identical uniform oscillatory fields (formed by microwave cavities) separated by a field-free drift region, $L_R$. The linewidth of the clock, Γ, is inversely proportional to $L_R$. In micro-beam clocks it is difficult to shrink the microwave cavities and still maintain uniformity inside the cavity while keeping the short drift region field-free. Instead of performing the spectroscopy in the spatial domain, temporal domain spectroscopy is employed. Time domain Ramsey spectroscopy on an expanding cold atom sample reduces the clock size without sacrificing the stability and precision. Using the antenna 60 (FIG. 1) connected to the 6.8 GHz LO 10 (FIG. 1), two pulses are created separated by a field-free drift time, $t_R$, and can overcome the pitfalls of the spatial domain spectroscopy when reduced to the micro-scale. The first pulse will occur after the fields are extinguished. The atomic clock of the present invention has almost a hundred times narrower linewidth than a micro-beam clock. After the second microwave pulse, the number of atoms in the F=2 state will be a maximum when the microwave radiation is on resonance with the F=1, mF=0 to F=2, mF=0 transition. Alternatively, and for shorter interrogation times, Rabi spectroscopy can be used. A single resonate pulse is used to transfer the atoms from F=1, mF=0 to F=2, mF=0. The linewidth of the clock scales inversely with the time between Ramsey pulse or the single duration of the Rabi pulse. The number of atoms in F=2 will be measured by fluorescence detection. The fluorescence curve is plotted out for each point atoms are trapped in a MOT, released, and probed. After being probed the atoms return to the background vapor, which is the source of atoms for subsequent MOT cycles. Because the Rb-87 is recycled, the atomic clock 8 has a long lifetime.

Unlike a beam clock which operates continuously, the embodiment of the atomic clock shown in FIG. 1 operates in pulsed-mode with approximately 1-10 Hz repetition rate. The pulsed operation enables low-power performance because resources can be turned off when not in use. Of the components of the atomic clock 8, the largest power consumer is the laser 20 (FIG. 1), described in more detail below, which is used to generate both the trapping and repumping frequencies.

Performance will be characterized by measuring the Allan deviation which can be estimated by:

$$\sigma_y(\tau) = \frac{\Delta v}{v_0 \frac{S}{N}} \sqrt{\frac{Tc}{\tau}}$$

where $\Delta v = 1/(t_R)$ is the integration time, $v_0 = 6.8$ GHz, and Tc is the total cycle time including the $t_R$ and the dead time. S/N is the signal-to-noise ratio per cycle. Using the value of $t_R$ a 5 $cm^3$ package (=70 Hz) will have $Na = 2.4\times10^6$ Rb-87 atoms after the second microwave pulse. Assuming a detection system is atom-shot-noise limited, S/N per cycle is S/N=Sqrt [Na]=1500.

Embodiments of the atomic clock can be operated over a wide temperature range without performance derogation by changing the repetition rate: in hot ambient environments Rb-87 atoms 40 are loaded more quickly into the MOT but have a shorter lifetime due to background collisions. For colder ambient environments, Rb-87 atoms 40 are loaded more slowly but have a longer lifetime. When operating in cold environments, there will be fewer cycles/second but each cycle will have a narrower clock resonance compared to room temperature operation and vice versa for hot ambient environments.

Figure 3:
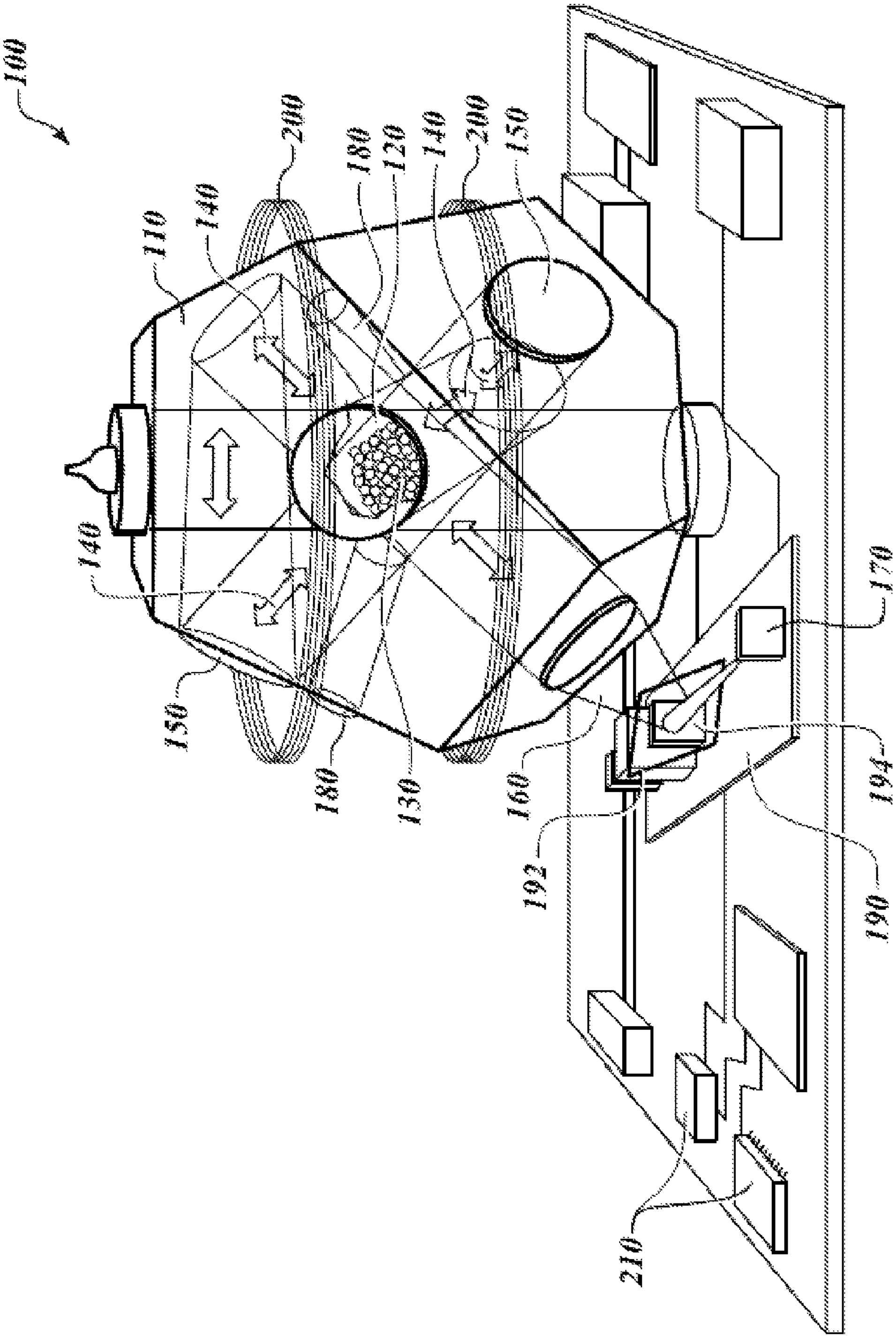
FIG. 3 is a schematic view of one embodiment of an atomic clock that utilizes a Magneto Optical Trap.

FIG. 3 is a schematic view of one embodiment of an atomic clock 100 that utilizes a Magneto Optical Trap ("MOT"). The atomic clock 100 includes: (1) a physics package 110 that comprises a vacuum chamber cavity 120 that holds alkali metal atoms 130 such as rubidium or cesium (for example, Rb-87) in a passive vacuum (with or without gettering agents), an arrangement of light paths 140 and mirrors 150 that directs a beam of light 160 from a single laser light source 170 through the physics package 110, and at least one photo-detector port 180 (two are shown in the illustrated embodiment); (2) a micro-optical bench 190 that includes the single laser light source 170, for example, a semiconductor laser such as a Vertical Cavity Surface Emitting Laser ("VCSEL"), a distributed feedback laser or an edge emitting laser, a vapor cell 192 containing an alkali metal such as rubidium or cesium (for example, Rb-87) and a mirror 194 for distributing the beam of light 160 to the vapor cell 192 and the physics package 110. (3) a plurality of magnetic field coils 200 (two in the illustrated embodiment), such as anti-Helmholtz coils, for generating a gradient magnetic field; (4) the Local Oscillator ("LO") 10 (see FIG. 1); (5) the antenna 30 (see FIG. 1); (6) the photo-detector 20 (see FIG. 1) (one is used for each photo-detector port 180 in the illustrated embodiment); and (7) control electronics 210. The arrangement of light paths 140 and mirrors 150 directs the beam of light 160 from the single laser light source 170 through the physics package 110 to create three retro-reflected optical beams that cross at 90° angles relative to one another in the vacuum chamber cavity 120. The optical beams and a magnetic field produced by the magnetic field coils 200 are used in combination to slow, cool, and trap the alkali metal atoms 130 (for example, Rb-87 atoms) from the background vapor and trap the Rb-87 atoms 40 (about 10 million atoms at a temperature of about 20 μK at the center of the intersection of the optical beams) in the MOT. The folded-retroreflected beam path makes efficient use of the single light source 170. The mirrors 150 (for example, dielectric mirrors) and diffractive optics are used to steer the optical beams and control the polarization of the optical beams, respectively, while minimizing scattered light and size. The vapor cell 192 containing an alkali metal is used to frequency stabilize the beam of light 160 from the single laser light source 170 to a predetermined atomic transition of the alkali metal. The LO 10 is used to generate a microwave signal corresponding to the predetermined atomic transition of the alkali metal. The antenna 30 is used to deliver the microwave signal from the LO 10 to the alkali metal atoms 130 of the physics package 110. Photo-detectors 20 are used for detecting the fluorescence of the alkali metal atoms 130 (for example, Rb-87 atoms).

All optical frequencies needed in the exemplary atomic clock of the present invention shown in FIG. 3 will be sourced by the single laser light source (for example, a VCSEL). The trapping frequency will be the 780 nm carrier; the repumping frequency will be a frequency sideband at 6.8 GHz; and the F=2 fluorescence detection will use the carrier frequency only. In the case of a VCSEL, the laser linewidth must be less than approximately 6 MHz, the natural linewidth of Rb, which is approximately ten times narrower than a typical VCSEL. The VCSEL has an optical power, P, of greater than approximately 10 mW and a linewidth less than approximately 3 MHz which is capable of being frequency modulated at 6.8 GHz. The VCSEL is frequency stabilized to an atomic line using the vapor cell 192 containing the alkali metal (for example, an external CSAC-like Rb vapor cell) on the micro-optical bench 190. For optimum performance, a vacuum of less than about $1\times10^{-7}$ to about $1\times10^{-8}$ torr is needed.

The control electronics 210, which are typically low noise miniature electronics, serve three primary functions: sequencing the cooling, free expansion, and measurement phases; locking the clock's LO 10 to the atomic resonance of the RB-87 atoms; and providing precision thermal control and wavelength stabilization to the VCSEL. In general, the control electronics 210 serve to provide power to the atomic clock 100, control the operation of the atomic clock 100 and process signals from the photo-detector 20. The control electronics 210 will include low level analog, RF, and digital signal circuits for optimal performance. Sequencing the MOT entails (1) frequency modulating the VCSEL at 6.8 GHz providing the necessary optical frequencies to cool and trap the Rb-87 atoms, (2) turning off the magnetic field generated by the magnetic field coils 200 prior to expansion, and (3) redirecting the 6.8 GHz modulation to the antenna 30 for the Ramsey interrogation. The LO 10 is locked to the atomic clock transition by using low noise photodetection techniques to extract the fluorescence signal which is fed back into an integrator whose output is provided to a microcontroller, keeping the LO 10 locked in step about the resonance line. Finally, the electronics must maintain the VCSEL at a precision temperature to mK or lower stabilities. Embodiments of the atomic clock achieve low power thermal and wavelength control via peak detection and resistive nulling bridges. Embodiments of the atomic clock combine ASIC/die implementations with limited discrete components to meet the size, performance and power goals dictated of the primary standard.

Figure 4:
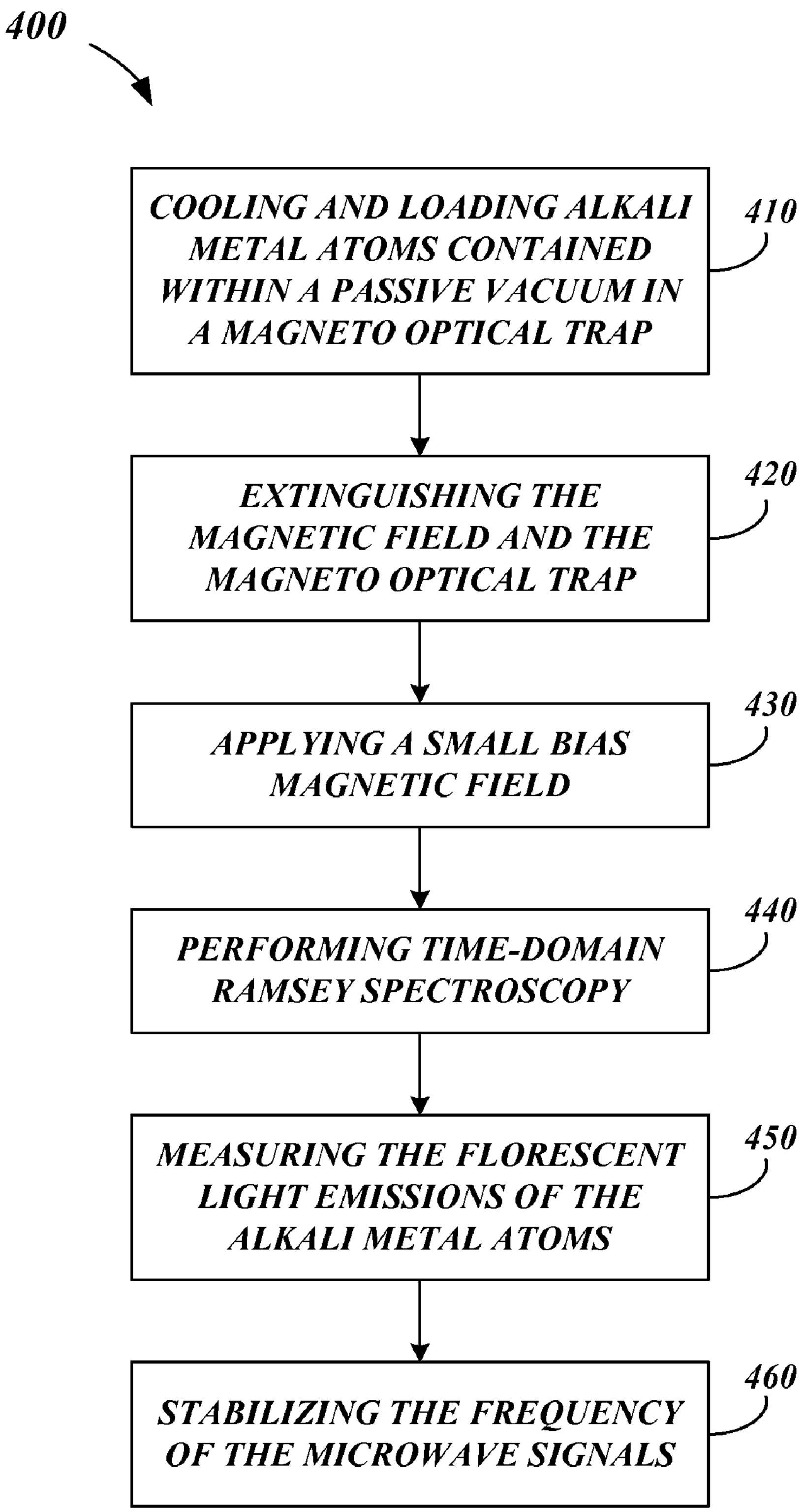
FIG. 4 is a flowchart depicting one embodiment of a method of forming a precision frequency standard.

FIG. 4 is a flowchart depicting one embodiment of a method 400 of forming a precision frequency standard. The method 400 begins with cooling and loading a population of alkali metal atoms contained within a passive vacuum in a magneto optical trap (410). The magneto optical trap is formed using a magnetic field and a beam of light from a single laser light source having a retro-reflected configuration that creates three retro-reflected optical beams that cross at 90° angles relative to one another. The magnetic field and the magneto optical trap is extinguished (420), then a small bias magnetic field is applied to allow the alkali metal atoms to move from a higher energy state to a lower energy state (430). The method 400 further comprises performing time-domain Ramsey spectroscopy (440) using microwave signals generated by a local oscillator and coupled to the alkali metal atoms by an antenna to probe the frequency splitting of the alkali metal atoms. The florescent light emissions of the alkali metal atoms are measured (450) with a photo-detector to determine the fraction of the alkali metal atoms in the higher energy state. Finally, the method 400 includes stabilizing the frequency of the microwave signals generated by the local oscillator to the frequency that maximizes the number of alkali metal atoms in the higher energy state (460).

A number of embodiments of the atomic clock defined by the following claims have been described. Nevertheless, it will be understood that various modifications to the described embodiments may be made without departing from the spirit and scope of the claimed invention. Features shown specific to one embodiment may be combined with, or replace, features shown in other embodiments. Accordingly, other embodiments are within the scope of the following claims.

What is claimed is:

1. An atomic clock comprising:

a physics package that comprises a vacuum chamber cavity that holds alkali metal atoms in a passive vacuum, an arrangement of light paths and mirrors that directs a beam of light from a single laser light source through the physics package to create three retro-reflected optical beams that cross at 90° angles relative to one another in the vacuum chamber cavity and at least one photo-detector port;

a micro-optics bench that comprises the single laser light source, a vapor cell containing an alkali metal for stabilizing the beam of light from the single laser light source to a frequency corresponding to a predetermined atomic transition of the alkali metal, and a distribution mirror for distributing the beam of light from the single laser light source to the vapor cell and the physics package;

a plurality of magnetic field coils for generating a magnetic field, whereby the magnetic field and the retro-reflected optical beams create a magneto optical trap for the alkali metal atoms of the physic package;

a local oscillator for generating a microwave signal corresponding to the predetermined atomic transition of the alkali metal;

an antenna for coupling the microwave signal to the alkali metal atoms of the physic package;

at least one photo-detector for detecting florescent light emissions of the alkali metal atoms of the physics package; and control electronics for providing power to the atomic clock, controlling the operation of the atomic clock and processing signals from the photo-detector.

2. The atomic clock of claim 1, wherein the alkali metal is rubidium or cesium.

3. The atomic clock of claim 1, wherein the single laser light source is a semiconductor laser.

4. The atomic clock of claim 3, wherein the semiconductor laser comprises one of a vertical cavity surface emitting laser ("VCSEL"), a distributed feedback laser, and an edge emitting laser.

5. The atomic clock of claim 1, wherein the magnetic field coils are anti-Helmholtz coils.

6. The atomic clock of claim 1, wherein the local oscillator comprises one of a micro-electromechanical system ("MEMS") resonator and a Colpitts electronic oscillator.

7. The atomic clock of claim 1, wherein the microwave signal has a frequency of 6.8 GHz.

8. The atomic clock of claim 1, wherein the antenna comprises one of a micro-electromechanical system ("MEMS") antenna, a coil, horn, and a micro-fabricated waveguide structure.

9. The atomic clock of claim 1, wherein the photo-detector is a photodiode.

10. The atomic clock of claim 1, wherein the control electronics are low noise miniature electronic components.

11. The atomic clock of claim 1, wherein the control electronics comprise low level analog, RF and digital signal circuits.

12. The atomic clock of claim 1, wherein the atomic clock has a volume ranging from about 5 $cm^3$ to about 30 $cm^3$.

13. The atomic clock of claim 1, wherein the vacuum has a pressure of about $10^{-7}$ torr to about $10^{-8}$ torr.

14. A method of forming a precision frequency standard comprising:

cooling and loading a population of alkali metal atoms contained within a passive vacuum in a magneto optical trap formed using a magnetic field and a beam of light from a single laser light source having a retro-reflected configuration that creates three retro-reflected optical beams that cross at 90° angles relative to one another;

extinguishing the magnetic field and the magneto optical trap and applying a small bias magnetic field to allow the alkali metal atoms to move from a higher energy state to a lower energy state;

performing spectroscopy using microwave signals generated by a local oscillator and coupled to the alkali metal atoms by an antenna to probe the frequency splitting of the alkali metal atoms;

measuring the florescent light emissions of the alkali metal atoms with a photo-detector to determine the fraction of the alkali metal atoms in the higher ground state energy level; and stabilizing the frequency of the microwave signals generated by the local oscillator to the frequency that maximizes the number of alkali metal atoms in the higher energy state.

15. The method of claim 14, wherein the alkali metal atoms are Rb-87.

16. The method of claim 14, wherein the lower energy state is the F=1 ground hyperfine state of Rb-87, the higher energy state is the F=2 ground hyperfine state of Rb-87 and the microwave signal has a frequency of 6.8 GHz which corresponds to the energy level spacing between F=1, mF=0 and F=2, mF=0.

17. The method of claim 14, wherein cooling and loading a population of alkali metal atoms further comprises cooling the atoms to approximately 20 μK.

18. The method of claim 14, wherein performing spectroscopy comprises one of time-domain Ramsey spectroscopy and Rabi spectroscopy.

19. An atomic clock comprising:

a physics package that comprises a vacuum chamber cavity that holds Rb-87 atoms in a passive vacuum, an arrangement of light paths and mirrors that directs a beam of light from a single laser light source through the physics package to create three retro-reflected optical beams that cross at 90° angles relative to one another in the vacuum chamber cavity and at least one photo-detector port;

a micro-optics bench that comprises the single laser light source, a vapor cell containing Rb-87 for stabilizing the beam of light from the single laser light source to a frequency corresponding to a predetermined atomic transition of the Rb-87, and a distribution mirror for distributing the beam of light from the single laser light source to the vapor cell and the physics package;

a plurality of magnetic field coils for generating a magnetic field, whereby the magnetic field and the retro-reflected optical beams create a magneto optical trap for the Rb-87 atoms in the physic package;

a local oscillator for generating a microwave signal corresponding to the predetermined atomic transition of the Rb-87;

an antenna for coupling the microwave signal to the Rb-87 atoms in the physic package;

at least one photo-detector for detecting florescent light emissions of the Rb-87 atoms in the physics package; and control electronics for providing power to the atomic clock, controlling the operation of the atomic clock and processing signals from the photo-detector.

20. The atomic clock of claim 19, wherein the predetermined atomic transition is the 6.8 GHz ground state frequency splitting between the F=1 and F=2 ground hyperfine states of Rb-87.

* * * * *